United States Patent [19]

Lucas

[11] 3,946,219
[45] Mar. 23, 1976

[54] MULTIPLE PURPOSE ELECTRONIC COUNTING SYSTEM
[75] Inventor: Richard K. Lucas, Enfield, Conn.
[73] Assignee: Veeder Industries, Inc., Hartford, Conn.
[22] Filed: Dec. 24, 1974
[21] Appl. No.: 536,165

[52] U.S. Cl. ............................ 235/159; 235/92 BD
[51] Int. Cl.² .......................................... G06F 7/38
[58] Field of Search ........ 235/92 BD, 92 DP, 150.3, 235/159

[56] References Cited
UNITED STATES PATENTS
3,544,773   12/1970   Peddie .............................. 235/92 BD

*Primary Examiner*—R. Stephen Dildine, Jr.
*Attorney, Agent, or Firm*—Prutzman, Hayes, Kalb & Chilton

[57] ABSTRACT

An electronic counting system with a solid state chip circuit having a multiple purpose counting and control system with an input signal operated control circuit selectively operable by input control signals from external circuitry for providing multiplication, division and rate computation functions and counting and two-stage predetermining functions, and also selectively operable by input control signals for selectively operationally partitioning a BCD RAM of the chip circuit into two separate RAM sections having selected numbers of BCD decade sets and operable to provide independent functions or interrelated functions. Data may be entered into each BCD decade of each of two BCD decade registers of the RAM directly by BCD and entry select signals applied to the chip circuit or by push button and entry select signals applied to the chip circuit.

36 Claims, 6 Drawing Figures ic counting system of the present invention;
MULTIPLE PURPOSE ELECTRONIC COUNTING SYSTEM

BRIEF SUMMARY OF THE INVENTION

The present invention relates generally to electronic counting systems and more particularly to a new and improved multiple purpose electronic counting system useful in a variety of applications and for a variety of purposes and having notable use, for example, in totalizing and predetermining systems and, in its preferred embodiment, also in rate and multiplication computation systems.

It is a primary aim of the present invention to provide a new and improved multiple purpose electronic counting system having a multiple purpose core circuit which can be manufactured as a large scale integrated (LSI) solid state chip (e.g. CMOS/SOS).

It is another aim of the present invention to provide an LSI chip having a new and improved multiple purpose logic circuit which may be employed as a core component and with a minimum number of peripheral components in a variety of counting and controlling applications.

It is a further aim of the present invention to provide a new and improved core circuit useful in providing independent or interrelated counting and predetermining functions for a plurality of separate input devices.

It is another aim of the present invention to provide a core circuit employing a bank of registers and a new and improved control circuit for selectively using the bank of registers for counting, predetermining and multiplication and rate computation functions. In accordance with the present invention, the registers are adapted to be selectively operated by the control circuit to provide independent register sections with selected numbers of decades and whereby the register sections may be operated independently or be interconnected in a variety of ways to provide great flexibility of operation and selectivity of application.

It is a further aim of the present invention to provide a new and improved multiple purpose core logic circuit design which may be constructed as an LSI chip utilizing state-of-the art LSI technology.

It is another aim of the present invention to provide a new and improved multiple purpose LSI chip core logic circuit having an output useful as an input for operating an LED or other suitable display device and/or as an input to external data handling equipment such as a special or general purpose computer. For example, the LSI chip core logic circuit of the present invention could be employed in a fluid dispensing system for counting and controlling the cost and/or volume amounts of fluid dispensed and be connected to a suitable display for displaying the cost and/or volume amounts of fluid dispensed and also to a suitable computer for storing the amount of each fluid delivery, for example, for totalizing the amount of the fluid delivered to each customer for credit billing purposes.

It is another aim of the present invention to provide a new and improved multiple purpose core counting circuit operable by primary and backup battery power sources and providing for data retention in the event of primary power loss.

It is another aim of the present invention to provide a new and improved multiple purpose core counting circuit having a plurality of separate data storage registers and a new and improved data input control circuit for writing data into the storage register decades.

It is a further aim of the present invention to provide a new and improved LSI chip multiple purpose core counting circuit having a plurality of separate storage registers and an efficient data handling logic system for selectively reading the storage register decades and writing data into the storage register decades.

Other objects will be in part obvious and in part pointed out more in detail hereinafter.

A better understanding of the invention will be obtained from the following detailed description and the accompanying drawings of illustrative applications of the invention.

DESCRIPTION OF THE PREFERRED EMBODIMENTS

Figure 1:
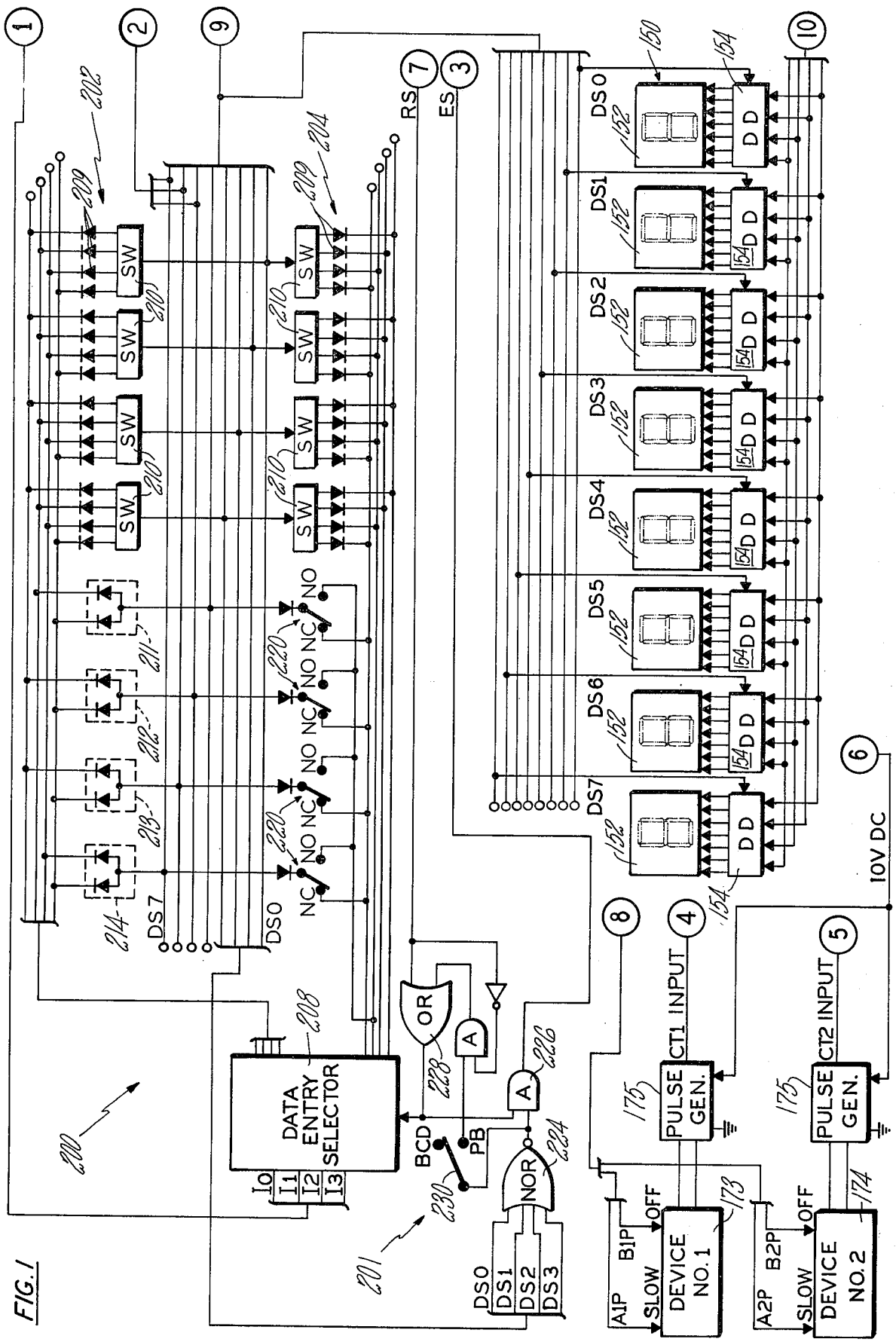
FIGS. 1–4 collectively provide a functional diagram or schematic, employing Boolean logic notation symbols, of a counting and predetermining system incorporating an embodiment of a multiple purpose electronic counting system of the present invention.

Referring now to the drawings in detail wherein like numerals and/or letters are used to designate like parts or logic signals and referring particularly to FIGS. 1–5, there is shown a counting and predetermining system incorporating an embodiment of a multiple purpose electronic counting system of the present invention. The multiple purpose electronic counting system employs an electronic core logic circuit 100, which in accordance with the present invention is preferably constructed in the form of an LSI chip (e.g., CMOS/SOS using state-of-the-art LSI technology). The LSI core logic circuit 100 is designed as hereinafter described to provide a highly versatile counting system core circuit useful in numerous applications requiring relatively few peripheral components. The shown LSI core circuit 100 has a standard number of 40 connector pins or contacts for making electrical connections between the core logic circuit 100 and the peripheral or external circuitry. 23 of the LSI chip connector pins or contacts are used for input connections to the LSI chip and the remaining seventeen LSI chip connector pins are used for LSI chip output connections, both as hereinafter described.

Figure 2:
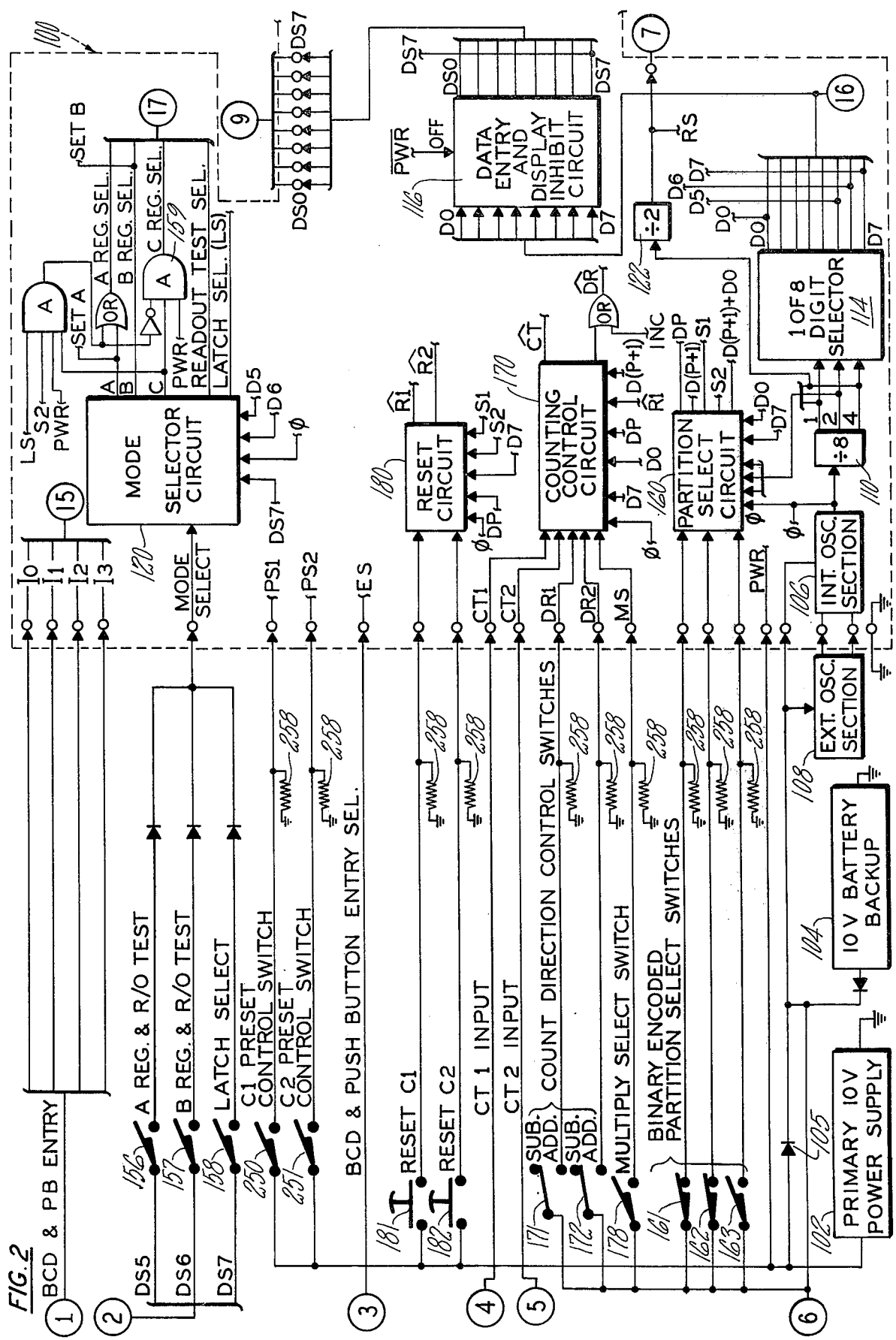

Referring now particularly to FIG. 2, the LSI chip 100, and also the remaining peripheral components, are shown supplied with 10 volt DC power by a primary power supply 102 and a 10 volt DC backup battery powder supply 104 which is isolated by diode 105 from certain circuits as desired and such that the battery 104 maintains only selected circuits active if the primary power supply 102 fails.

The primary and battery power supplies 102, 104 are connected to the LSI chip 100 to supply power to the chip circuits including an LSI chip internal oscillator section 106. The primary power supply 102 is also connected to the LSI chip to provide a power logic signal designated PWR to provide for deactivating certain LSI chip circuits when the primary power supply 102 fails. The chip oscillator section 106 is also connected to an external oscillator section 108 which incorporates resistance and capacitor components (not separately shown) which can be chosen without regard to the limitations of LSI chip technology and which can be selected to establish the oscillator frequency desired for the particular application of the LSI chip. If desired, the entire oscillator circuit could be provided on the LSI chip 100 or externally of the LSI chip; however, the described combination of internal and external oscillator sections 106, 108 provides the optimum combination of flexibility and LSI chip economy.

In the shown embodiment, the oscillator generates a clock signal designated $\phi$ having a frequency of 80 kHz and which is supplied as shown to various components of the LSI chip 100 for timing and synchronizing various logic functions of the LSI chip. Also, the oscillator is connected to a divide-by-eight counting circuit 110 having a three conductor binary output and operated by the clock signal $\phi$ to be repetitively stepped through its cycle to eight steps to provide a repetitive eight step binary readout.

The eight step cycle established by the divide-by-eight circuit 110 is the basic operating cycle of the circuit and which in the shown embodiment has a 10 kHz frequency. During each such operating cycle, a 1 of 8 digit selector 114 generates eight sequential digit logic signals designated D0 through D7, which are used as digit select signals etc. as hereinafter described for controlling and timing certain internal functions of the LSI chip during each chip operating cycle. In addition, the D0-D7 digit signals are supplied via a data entry and display inhibit logic circuit 116 to generate corresponding DS0-DS7 digit select or timing signals for use in the external circuit as hereinafter described. The DS7 digit signal is also connected internally to a mode selector logic circuit 120 for the purpose described hereinafter. The data entry and display inhibit logic circuit 116 is operated by the primary power signal PWR such that the DS0-DS7 signals are not generated when the primary power supply 102 fails and so that certain external components are thereupon deactivated to conserve backup battery power.

Figure 5:
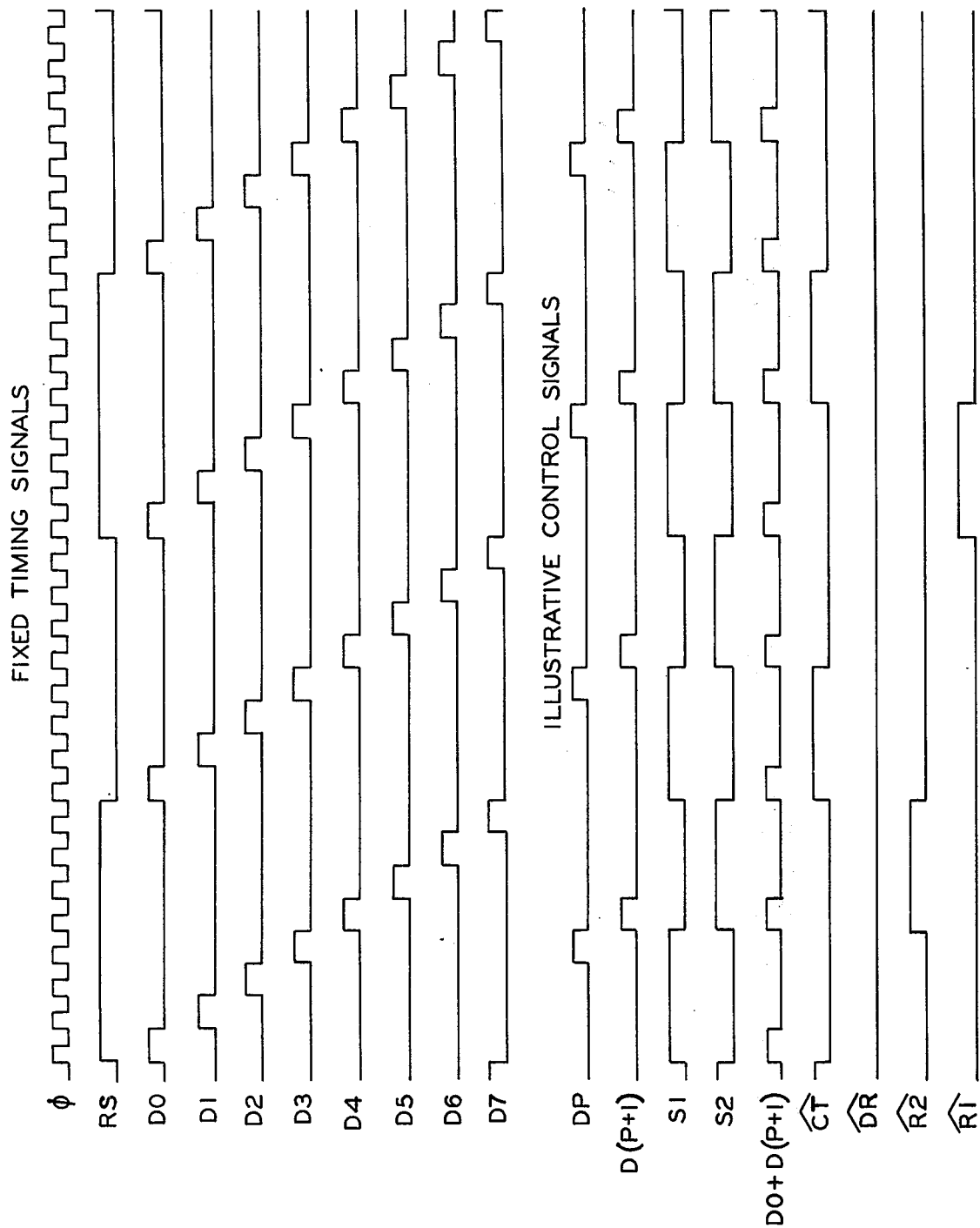
FIG. 5 is a timing chart showing nonvariable and representative variable logic signals of the system of FIGS. 1–4.

The output conductor from the divide-by-eight circuit 110 having the binary encoded value of 4 is also connected to a divide-by-two circuit 122 to provide a register select logic signal designated RS. The register select logic signal RS remains at the logic 0 level during alternate chip operating cycle and at the logic 1 level during the intermediate alternate chip operating cycles. FIG. 5 shows the timing relationship of certain logic signals described and to be described hereinafter.

Figure 3:
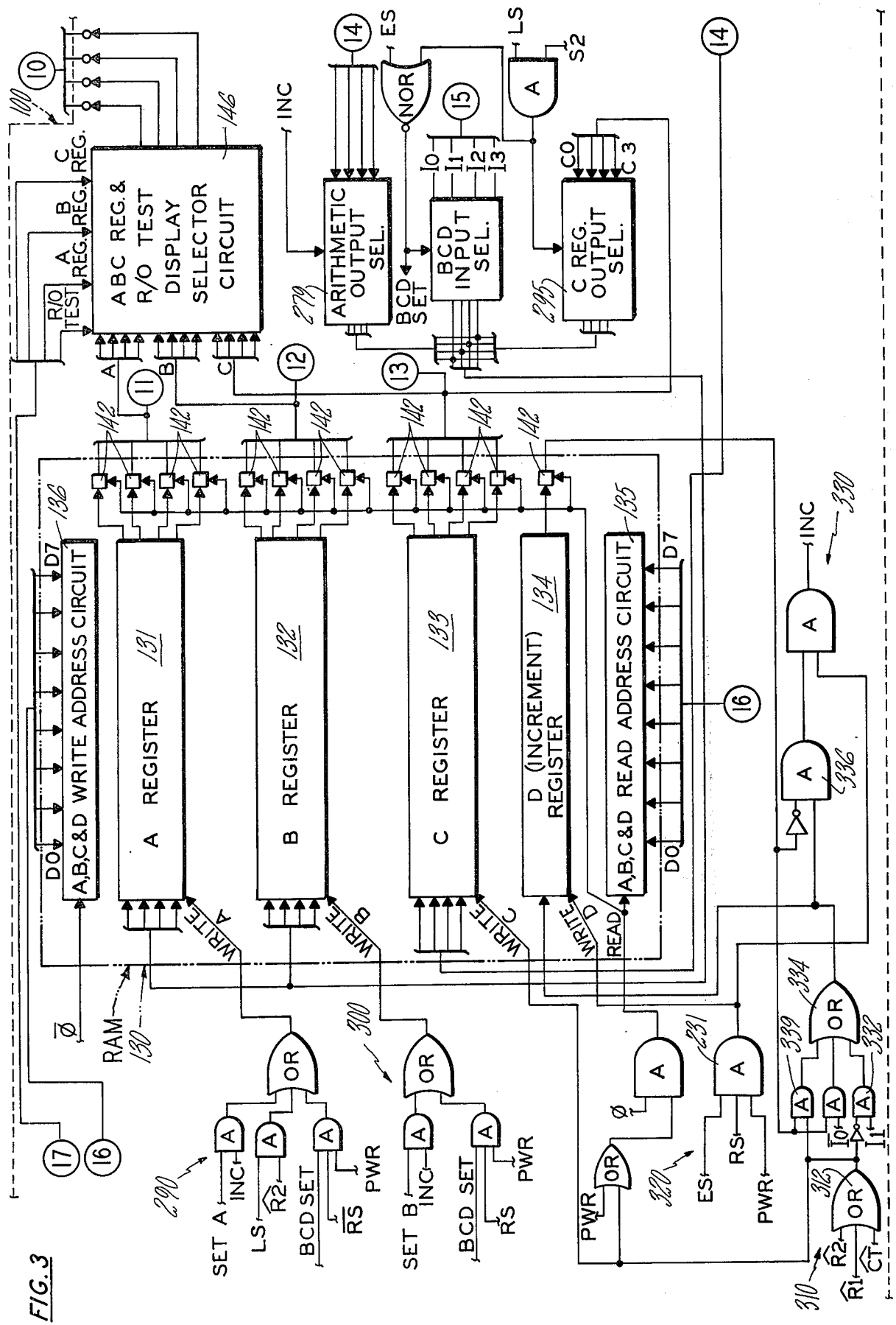

Referring to FIG. 3, the LSI chip circuit comprises a random access memory (RAM) 130 having a bank of three substantially identical eight word or eight decade BCD storage registers 131–133, designated the A, B and C registers respectively, and an eight digit increment storage register 134 designated the D register. The RAM 130 also has suitable decade read and write address circuits 135, 136 respectively operated by the D0-D7 digit signals to address the corresponding decades and digits of the A, B, C and D registers together and to address the eight decades and digits of the registers in sequence. The A, B and C storage registers have respective BCD inputs, respective BCD outputs, and respective write inputs for selectively writing their BCD inputs into the respective words of the RAM as they are sequentially addressed or activated by the write address circuit 136.

Similarly, the eight digit increment register D (which comprises a single binary storage bit for each digit) has a binary input, a binary output and a write input for selectively writing its input into its storage digits as they are sequentially addressed or activated by the write address circuit 136. The read and write address circuits 135 and 136 are connected to be operated by the $\phi$ clock signals and D0-D7 digit signals for simultaneously addressing corresponding decades and digits of the A, B, C and D registers. The addressed or activated decades and digits are automatically read during the first half or read phase of each digit cycle D0-D7 (i.e., during $\phi$) and the readouts are simultaneously stored in corresponding readout storage circuits or latches 142. The register inputs are adapted to be selectively written into the register decades or digits during the last half or write phase of each digit cycle D0-D7 (i.e., during $\bar{\phi}$) and therefore after the prior data has been read and stored in the readout storage latches 142.

The BCD outputs from the A, B and C registers storage latches 142 are connected via a display selector logic circuit 146 and four BCD readout pins of the LSI chip 100 for operating an eight digit display register 150 utilizing suitable digit display devices 152, such as LED seven bar of FIG. 8 display devices, and suitable decoder-driver circuits 154. The DS0-DS7 digit select pins are also connected to the display register 150 for strobing the digit display devices 152 in sequence and in synchronism with the sequential reading of the decades of the selected register. Accordingly, the eight digit readout of each internal register A, B and C may be selectively displayed with the external register 150 in accordance with the operation of the selector circuit 146. Similarly, the BCD readout pins and the DS0-DS7 digit select pins may be connected to a suitable data storage installation utilizing, for example, a special or general purpose computer to enter the BCD data stored in the internal registers A, B and C into an external data storage device, for example, for obtaining a record, printed or otherwise, of the internal register readouts for accounting or other purposes.

The display selector circuit 146 has three control inputs for respectively selecting the A, B and C register inputs and a fourth control input for selecting a readout test selection where the BCD output is held at binary 8 to register 8 in all of the digit displays and thereby test the operation of all of the register display elements (e.g. LED display elements). Referring to FIG. 2, the four control inputs to the display selector circuit 146 are selectively established via the mode selector logic circuit 12 by a binary input signal from two external mode selector switches 156 and 157. The external mode selector switches 156, 157 and a third external latch select switch 158 having a function hereinafter described, are connected to the mode selector circuit 120 via a single LSI chip contact pin. The selector switches 156–158 are connected to be individually strobed by the DS5, DS6 and DS7 digit signals. The mode selector circuit 120 is similarly simultaneously clocked by the D5, D6 and DS7 digit signals and contains suitable logic control and storage circuitry to provide the following:

a. When the mode selector switch 156 is closed and the mode selector switch 157 is open, an A register logic 1 select signal is applied to an A output of the mode selector circuit 120 to operate the display selector circuit 146 to display the A register readout.

b. When the mode selector switch 157 is closed and the mode selector switch 156 is open, a B register logic 1 select signal is applied to a B output of the mode selector circuit 120 to operate the display selector circuit 146 to display the B register readout.

c. When both mode selector switches 156, 157 are closed, a readout test logic 1 select signal is generated by the mode selector circuit 120 to operate the display selector circuit 146 to display an "8" in each of the digit display devices 152.

d. When both mode selector switches 156, 157 are open, a C register logic 1 select signal is applied to a C output of the mode selector circuit 120 to normally operate, via an AND gate 159, the display selector circuit 146 to display the C register readout. The AND gate 159 is controlled by the PWR signal so that when the primary power supply 102 fails, the display selector circuit 146 is switched to produce a BCD 0000 output to save power. In that regard, the mode selector switches 156, 157 are sensed as being open when the primary power 102 fails (since the DS5 and DS6 digit signals would not then be generated) whereby the display selector circuit 146 would otherwise be operated to display the C register readout when the primary power fails.

e. When the latch selector switch 158 is closed, a latch select logic 1 control signal designated LS is generated by the selector circuit 120 for use as hereinafter described. In that regard, the digit signal DS7 instead of the digit signal D7 is employed as the internal clock input to the mode selector circuit 120 so that the selector circuit 120 is retained in the LS mode if the primary power 102 fails after that mode has been selected.

A register partition select logic circuit 160 is connected to be selectively operated by three external partition selector switches 161–163 for selectively applying an input binary partitioning signal to the partition select logic circuit 160. The partition select circuit 160 is employed for generating partitioning logic signals (i.e., digit signals designated DP; D(P+1); and D(P+1)+DO; and register section signals designated S1; and S2) for operationally partitioning the RAM 130 into two independent RAM sections which are then individually and separately operable to provide in effect two separate C register sections hereinafter designated the C1 and C2 registers, and corresponding separate A and B register sections hereinafter designated the A1, A2 and B1, B2 registers respectively. The partition select circuit 160 is suitably designed so that the input binary partitioning signal is operable to establish a digit logic 1 select signal designated DP during any digit D0-D7, from digit D0 (where none of the switches 161–163 are closed) to digit D7 (where all of the switches 161–163 are closed). As hereinafter described, the DP digit partition signal establishes the last decade of the first section of the RAM 130. Thus, for example, where only the switches 161 and 162 are closed as shown in FIG. 2 to establish a binary input partition signal having a binary encoded value of 3, the DP digit signal will occur at digit D3 (i.e., the fourth decade of the RAM 130) and the RAM partitioning will occur between its fourth and fifth decades. In that event, the C1 register will be a four decade register, and the corresponding A1 and B1 registers will be four decade registers. Similarly, the C2 register will then be a four decade register (i.e. having the remaining fifth through eighth decades) and the corresponding A2 and B2 registers will be four decade registers. The partition select logic circuit 160 also has suitable logic circuitry to produce the following outputs:

a. a digit signal designated D(P+1) establishing the first decade of the A2, B2 and C2 registers;

b. a first section logic 1 signal designated S1 occurring during the first section;

c. a second section logic 1 signal designated S2 occurring during the second section; and d. a logic 1 digit signal designated D(P+1)+DO occurring during the first decade of each section.

The foregoing signals generated by the partition select logic circuit 160 are shown in FIG. 5 for the exemplified partitioning shown in FIG. 2 where the partition switches 161 and 162 are closed and the remaining partition switch 163 is open and the RAM 130 is thereby operationally partitioned into two four-decade register sections.

The partitioning select circuit 160 would similarly provide partitioning signals for operationally partitioning the RAM into first and second RAM sections respectively having (a) one and seven decades (where all the switches 161–163 are open); (b) two and six decades (where switches 161 is closed and switches 162, 163 are open); (c) three and five decades (where switch 162 is closed and switches 161, 163 are open); (d) five and three decades (where switch 163 is closed and switches 161, 162 are open); (e) six and two decades (where switches 161, 163 are closed and switch 162 is open); and (f) seven and one decades (where switches 162, 163 are closed and switch 161 is open). Where all of the switches 161–163 are closed, there would be no operational partitioning of the RAM 130 and in effect the first section would have eight decades.

A counting control logic circuit 170 is provided for receiving separate input counting signals or pulses designated CT1 and CT2 and for receiving corresponding count direction control signals designated DR1 and DR2 established by a pair of count direction control switches 171, 172. In the embodiment shown in FIGS. 1–5 two separate devices designated by the numerals 173, 174 are mechanically connected for operating separate pulse generators 175 which are designed for generating input pulse trains of suitable input or count pulses CT1 and CT2 to the counting control logic circuit 170. The devices 173, 174 may be the same or similar or be completely different. Also, the devices may operate independently or be interrelated parts of the same system, machine or installation. For example, the devices 173, 174 may be separate fluid pumps for independently delivering fluid to customers and be connected for driving the respective pulse generators for generating count pulses CT1, CT2 for each one cent of fluid delivered by the respective pump and whereby the cost amount of the fluid delivered by each pump could be accumulated or stored within the chip 100 and selectively read with the display register 150. In contrast, the devices 173, 174 could be different sections of the same machine, for example, a knitting machine and wherein one pulse generator 175 is driven to generate a pulse for each pre-established length of yarn used by the knitting machine and the other pulse generator 175 is driven to generate a pulse for each cycle of the knitting machine and such that the counts could be compared (automatically by the circuit if desired) to determine the length of yarn used for each machine cycle and the knitting machine then adjusted as desired. Such applications of the chip 100 are exemplary and, as will become more evident hereinafter, the logic circuit of the chip 100 may be employed as the core circuit in numerous counting, predetermining, controlling and computing applications, and the external circuitry used will depend on the application. Also, it is contemplated that at least some of the external switches shown (e.g., switches 161–163) would be hard wired as desired in those applications in which those inputs would not be changed.

Also, as will be more fully described hereinafter, where the LSI chip 100 is used with two count inputs CT1 and CT2, the RAM 130 is then divided into two RAM sections for the two inputs (with the partition switches 161-163 and with the partitioning selected in accordance with the desired maximum count to be accumulated in each RAM section). Thus, where the devices 173, 174 are the same or similar but are independently operated, the partition switches 161–163 may be set as in the shown embodiment to partition the RAM into two RAM sections having equal decade storage capacity.

As hereinafter more fully explained, the applied CT1 count pulses are accumulated in the first section of the RAM 130 and the applied CT2 count pulses are accumulated in the second RAM section (and if the RAM 130 is not partitioned only the CT1 pulses are accumulated and any CT2 pulses are ineffective).

The counting control logic circuit 170 is connected to receive the digit signals D0, DP, D(P+1) and D7, the clock signal $\phi$, and an additional reset signal designated $\widehat{R1}$ hereinafter described. Also, an external multiply selector switch 178 is provided for conditioning the chip circuit 100 for performing a multiplication operation as hereinafter described.

The maximum available input or counting frequency with the described 80 kHz oscillator is nominally 10 kHz (i.e. the D0-D7 digit cycle frequency) and such that a CT1 and/or CT2 pulse may be applied during each D0-D7 operating cycle of the RAM 130. However, as will become evident hereinafter, the counting frequency must be at least slightly less than the nominal 10 kHz frequency to provide "open" operating cycles for entering data into the A and B registers by external push buttons.

The counting control circuit 170 is suitably designed so that a logic 1 count signal designated $\widehat{CT}$ is generated during an entire first RAM section cycle or digit sequence by the application of a corresponding CT1 pulse. Similarly, a logic 1 count signal $\widehat{CT}$ is generated during an entire second RAM section cycle or digit sequence by a CT2 pulse. Also, a $\widehat{DR}$ logic 1 signal is generated during a RAM section cycle if the corresponding count direction switch 171, 172 is closed, whereas the $\widehat{DR}$ signal is held at logic 0 for a RAM section cycle if the corresponding switch 171, 172 is open. Also, the $\widehat{DR}$ signal is held at logic 1 by an increment signal designated INC for push button data entry into the RAM 130 as hereinafter described.

The counting control circuit 170 is operated by each CT1 and CT2 input pulse upon an initial logic 0 to logic 1 transition of the pulse and each CT1 and CT2 input pulse is suitably temporarily stored in the counting control circuit 170 until the commencement of the next corresponding section cycle established by the respective D0 and D(P+1) digit signals. Thus, when a CT1 input pulse is applied to the circuit 170, a $\widehat{CT}$ logic 1 signal is generated (along with an appropriate $\widehat{DR}$ logic signal) during the first RAM section for indexing the C1 register in the additive or subtractive direction depending on the DR1 input (all as hereinafter described). Similarly, when a CT2 input pulse is generated, a $\widehat{CT}$ logic 1 signal is generated (along with an appropriate $\widehat{DR}$ logic signal) during the second RAM section cycle to index the C2 register.

A reset logic circuit 180 of the LSI chip 100 is connected internally to receive the clock signal $\phi$, the digit signals DP and D7, and the RAM section signals S1 and S2. In the shown embodiment, a pair of external push button reset switches 181, 182 are connected to the reset logic circuit 180 via a pair of chip connector pins or contacts to provide for resetting the C1 and C2 registers respectively. For that purpose, a logic 1 reset signal designated $\widehat{R1}$ is generated during the first RAM section cycle to reset the C1 register when the reset switch button 181 is depressed, and a separate logic 1 reset signal designated $\widehat{R2}$ is generated during the second RAM section cycle to reset the C2 register when the reset button 182 is depressed. Exemplary $\widehat{R1}$ and $\widehat{R2}$ logic 1 reset signals are shown in the timing diagram of FIG. 5.

The $\widehat{R1}$ reset signal is also applied to the counting control circuit 170, and the circuit 170 is suitably designed so that when the multiply selector switch 178 is closed, the CT2 input is inhibited (and is therefore not used while the multiply select switch 178 is closed) and a CT1 input pulse provides a continuous $\widehat{CT}$ logic 1 signal during the succeeding first and second RAM section cycles until an $\widehat{R1}$ signal is generated and which then resets only the C1 register. Consequently, a CT1 input pulse will provide for indexing the C1 and C2 registers one count for each RAM cycle (i.e. at 10 kHz in the described embodiment) until an $\widehat{R1}$ signal is generated. As hereinafter described, the multiply selector switch 178 can then be used for accumulating in the C2 register the product of a first variable number equal to the number of CT1 input pulses and a second fixed number stored in the A1 or B1 register (and employed for generating an $\widehat{R1}$ reset signal when the C1 register count equals the number stored in the selected register A1 or B1).

The external circuit also includes a combination BCD and push button data entry circuit generally denoted by the numeral 200 for entering counts into the A and B register decades. The data entry circuit 200 employs a BCD/push button (PB) entry select circuit 201 for automatically generating logic 1 entry select digit signals designated ES for permitting push button entry into selected A and B register decades as hereinafter described. Also, as hereinafter described, during each A and B register decade the ES digit signal is at logic 0, BCD data is automatically entered into the register decade.

The data entry circuit 200 also comprises A register and B register entry networks 202, 204 respectively, each having eight separate digit entry switching circuits for the eight RAM decades respectively and strobed by the DS0-DS7 digit signals for steering their binary outputs into corresponding decades of the A and B registers. The entry networks 202, 204 have four lead binary outputs adapted to be selectively connected to a four lead binary input of the LSI chip 100 by a data entry selector logic circuit 208 to selectively transmit their binary outputs as binary input signals designated I0-I3 to the chip. The data entry selector 208 is controlled in part by the RS register select signal so that the A register entry network 202 normally provides the binary input to the LSI chip 100 for entering data into the A register when RS is at logic 0, and the B register entry network 204 normally provides the binary input to the LSI chip 100 for entering data into the B register when RS is at logic 1. Thus, excepting as hereinafter described, during the alternating register cycles when RS is at logic 0, data is or may be entered into the A register and during the intermediate alternating register cycles when RS is at logic 1, data is or may be entered into the B register.

The shown A register entry network 202 comprises four manually settable BCD selector switches 210 for the first four decades of the A register (and therefore for all four of the decades of the A1 register in the described embodiment). The BCD selector switches 210 may, for example, be BCD switches of the type shown and described in U.S. Pat. No. 3,445,636 of Joseph A. Richards entitled "Single Wheel Counter Circuit" and dated May 20, 1969, and having a number wheel (not shown) providing a numerical readout of the binary switch position and suitable means (not shown) such as a push button for selectively setting the switch and number wheel. The BCD switches 210 are suitably isolated, as by the provision of diodes 209 in each output lead of each switch, to prevent feedback through inactive switches and such that the BCD output generated during the corresponding digit cycle is dependent solely on the setting of the active BCD switch 210.

The four BCD switches 210 of the A register input network 202 are strobed by the corresponding DS0-DS3 digit select signals to individually apply their BCD outputs via the data entry selector 208 as BCD inputs I0-I3 to the LSI chip 100 (when the control signal to the data entry selector 208 is at the logic 0 level). Similarly, four non-settable or hard wired BCD switches 211-214 of the A register input network 202 are strobed by the corresponding DS4-DS7 digit signals to individually apply their BCD outputs via the data entry selector 208 as BCD inputs 10-I3 to the LSI chip 100 (also when the control signal to the selector 208 is at the logic 0 level). The four non-settable switches 211-214 which are shown provide BCD outputs for the numbers 5, 9, 9, 5 respectively, whereby those amounts are entered in BCD form into the corresponding A register decades.

The B register entry network 204 could be the same or similar to the A register entry network 202. In the embodiment shown in FIG. 1, the B register network 204 comprises four manually settable BCD switches 210 strobed by the DS0-DS3 digit signals respectively for entering their manually settable BCD outputs into the first four decades of the B register (when the control signal to the selector 208 is at the logic 1 level). The remaining entry switches 220 for the last four decades of the B register are single pole, double throw (form C) push button switches having a normally closed (NC) fixed contact and a normally open (NO) fixed contact adapted to be energized by manually depressing the push button switch 220. The push button switches 220 are break-before-make switches and each NO switch contact is connected to apply a logic 1 signal to the BCD 2 output of the network 204 by the corresponding DS4-DS7 digit signal when the push button is depressed. With a push button switch 220 in its normal position in engagement with its NC contact, a logic 1 signal is applied to the BCD 1 output of the network 204 by the corresponding digit signal DS4-DS7. The resulting I0 and I1 signals transmitted to within the LSI chip provide the logic control signals for individually indexing the decades of the A and/or B registers.

As previously described, an entry select signal ES is applied to the LSI chip 100 to selectively establish either push button or BCD entry into the A and B registers digits during each register digit cycle. An ES logic 1 digit signal permits push button entry and inhibits BCD entry, and an ES logic 0 digit signal provides for automatic BCD entry and inhibits push button entry. For the purpose of generating the ES logic 1 digit signals for push button entry, the DS0-DS3 digit signals are applied via a NOR gate 224 and an AND gate 226 (and the register select signal RS is also applied to the AND gate 226 via an OR gate 228) to generate ES logic 1 digit signals during the last four digit cycles of the B register cycle, thereby permitting push button entry into the last four decades of the B register with the respective digit push buttons 220.

The digit push buttons 220 can also be used to provide push button entry into the A register by switching an A register entry select switch 230 from its open or BCD position shown to its push button or closed position. In that event, the entry select circuit 201 is operated to generate ES logic 1 signals during the last four digit cycles of the A register cycle to inhibit BCD entry into the A register. The data entry selector 208 is also operated so that the push button entry switches 220 are then used instead of the switches 211-214 to enter data into the last four digits of the A register. As described hereinafter, push button entry is made during only one of the two alternating register cycles (established during the B register cycle by the AND gate 231 (FIG. 3) in the shown embodiment) and the push button increment entered into the selected register digit is also simultaneously entered into the corresponding digit of the increment or D register and stored there through the following D register cycles and until the push button is released. The D register is connected so that the selected digit is incremented only once each time the corresponding push button is depressed. Push button entry into the A register is selected by closing the A register mode switch 156 and opening the B register mode switch 157. Likewise, push button entry into the B register is selected by closing the B register mode switch 157 and opening the A register mode switch 156. Accordingly, each push button entry switch 220 can then be used for selectively entering data into the corresponding decade of the A and B registers as desired (and in accordance with the operation of the external mode switches 156, 157).

Figure 6:
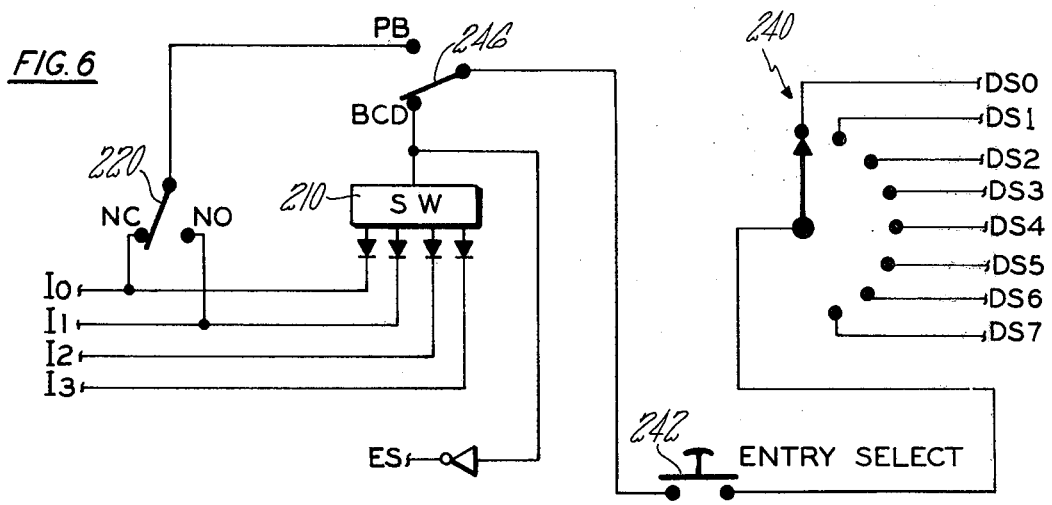
FIG. 6 is a partial diagram or schematic of a modified data input circuit for the system of FIGS. 1–4.

Of course, each data entry network 202, 204 could include any combination of non-settable switches and manually settable BCD and push button switches as desired, it being understood that the entry select circuit 201 would be designed accordingly to properly establish an ES logic 1 digit signal during each digit of each register cycle during which push button entry is to be made. Also, for example as shown in FIG. 6, a manually operable switch--either a push button entry switch 220 or a manually settable BCD switch 210, or both, could be employed with a suitable manually settable digit selector circuit 240, an entry select push button switch 242, and a BCD/PB entry mode switch 246 for entering data into each of the decades of each of the A and B registers (the A & B registers being individually selected with the mode selector switches 156, 157 respectively as described).

The external circuitry also includes preset control switches 250, 251 for controlling how the C1 and C2 registers are reset. The C1 and C2 preset control switches 250, 251 when closed establish PS1 and PS2 logic 1 preset control signals for (a) resetting the C1 and C2 registers to the counts stored in the B1 and B2 registers respectively (when they are reset by the $\widehat{R1}$ and $\widehat{R2}$ logic 1 reset signals) and (b) generating predetermining signals (designated B1P and B2P respectively) when the C1 and C2 registers are indexed (in either direction as established by the direction control switches 171, 172 respectively) to zero. The preset control switches 250, 251 when open establish PS1 and PS2 logic 0 control signals for (a) respectively resetting the C1 and C2 registers to zero (when they are reset by the $\widehat{R1}$ and $\widehat{R2}$ logic 1 reset signals) and (b) generating predetermining signals (B1P and B2P respectively) when the C1 and C2 registers are indexed to the counts stored in the B1 and B2 registers respectively. (Also, as hereinafter described, A register predetermining signals designated A1P and A2P are generated when the C1 and C2 register counts equal the counts stored in the A1 and A2 registers respectively).

Where necessary, suitable resistor circuits 258 are provided with the external switches for connecting the LSI contacts to ground or zero potential for switching the LSI contacts to the logic 0 level when the respective external switch is opened.

Figure 4:
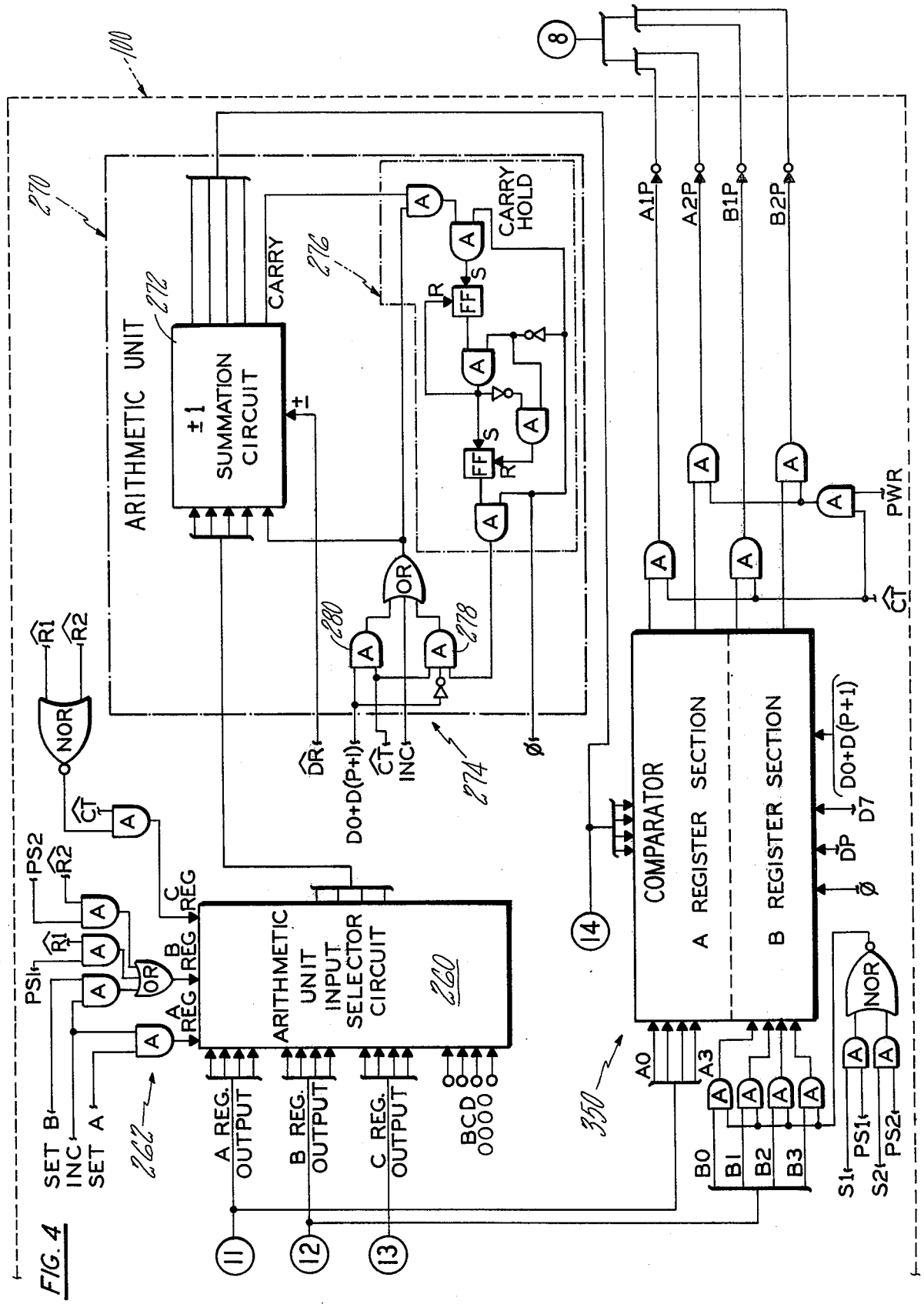

Referring to FIGS. 3 and 4, the BCD outputs from the A, B and C registers are adapted to be selectively connected via an arithmetic unit input selector logic circuit 260 to an arithmetic unit logic circuit 270. Separate A, B and C register control inputs to the input selector 260 are provided for selecting the A, B and C register outputs respectively, and the selector 260 provides for entering a BCD 0000 input into the arithmetic unit 270 (for resetting the C1 and C2 registers to zero) when the A, B and C register outputs are not selected. The selection of the A, B and C register outputs can be determined by consideration of the input logic control circuitry 262 to the input selector 260. Briefly, the C register output is selected by $\overline{CT}$ (excepting during an $\widehat{R1}$ or $\widehat{R2}$ reset signal) and therefore during a RAM section cycle the C1 or C2 register is indexed. As will be seen hereinafter, the C register output is selected for indexing the C1 or C2 register by a corresponding CT1 or CT2 input pulse.

The A and B register outputs are respectively selected for push button entry into the A and B registers by the combination of INC, hereinafter described, and (a) a SET A logic 1 signal (established by the mode selector 120 when the A register is selected with the mode selector switch 156) or (b) a SET B logic 1 signal (established by the mode selector 120 when the B register is selected with the selector switch 157). An INC logic 1 signal adapted to be generated by an external push button is not generated during a $\overline{CT}$ logic 1 signal and such that the A and B registers cannot be selected when the C register is selected with the $\overline{CT}$ signal; excepting, however, that the B1 and B2 registers are selected during $\widehat{R1}$ and $\widehat{R2}$ respectively when the C1 and C2 preset control switches 250, 251 respectively are closed. In that event, the amounts stored in the B1 and B2 registers are transferred via the selector 260 and arithmetic unit 270 to the C1 and C2 registers respectively. More particularly the B1 register is selected by R1 and PS1 (and therefore when the C1 preset control switch 250 is closed) for presetting the C1 register with the count stored in the B1 register. The B2 register is selected by $\widehat{R2}$ and PS2 (and therefore when the C2 preset control switch 251 is closed) for presetting the C2 register with the count stored in the B2 register.

The arithmetic unit logic circuit 270 comprises a suitable bidirectional summation or adder logic circuit 272 having a BCD input from the input selector 260, a $\overline{DR}$ input for establishing its direction of operation (plus or minus) and an "add one" input signal provided by a control logic circuit 274. The BCD output signal of the summation circuit 272 is the same as its BCD input signal when an add one input signal is not applied to the summation circuit 272. The summation circuit 272 is suitably designed to generate a carry signal (i.e., when the BCD input is 9 and a count one is added or when the BCD input is zero and one count is substracted) and any carry signal generated during a digit cycle is temporarily stored in a suitable carry hold logic circuit 276 until the next digit cycle where it can be selectively added to the next register decade. In that regard, the carry hold logic circuit 276 is shown clocked by $\phi$ for temporarily storing any carry signal during the read phase of each digit cycle and for then transmitting any stored carry signal via an AND control gate 278 as an add one signal to the summation circuit 272 during the read phase of the succeeding digit cycle.

An add one signal is applied to the summation circuit 272 during the first digit cycle D0 or D(P+1) of $\overline{CT}$ when a $\overline{CT}$ logic 1 signal is applied to the AND gate 280. Accordingly, an additional count is added or subtracted (depending upon DR) to the BCD amount stored in the first digit of the corresponding C1 or C2 register during the read phase of the digit cycle when a corresponding $\overline{CT}$ signal is generated. The BCD output of the summation circuit 272 is connected directly to the C register input for writing the summation into the same register decade during the immediately following write phase (i.e. $\bar{\phi}$) of the digit cycle. Similarly, any carry signal temporarily stored in the carry hold circuit 276 is transmitted to the summation circuit 272 via the AND control gate 278 to be added or substracted (according to $\overline{DR}$) to the BCD amount stored in the succeeding C register decade. However, a carry signal is not carried from the last decade of the C1 register to the first decade of the C2 register or from the last decade of the C2 register to the first decade of the C1 register because the carry control gate 278 is made non-conductive during the first decade of the C1 and C2 registers.

Also, for push button entry into selected A and B register decades, the summation circuit 272 is adapted to be operated to add one ($\overline{DR}$ being held at the logic 1 level by an INC logic 1 signal) to the BCD amount stored in the selected register decade by the application of an INC signal to the control circuit 274 (during the read phase (i.e. $\phi$) of the register decade cycle). The BCD output of the summation circuit 272 is then transmitted via an arithmetic unit output selector logic circuit 279 (operated by INC) to the A and B register inputs to be written into the selected register decade during the write phase (i.e. $\bar{\phi}$) of the digit cycle. Any resultant carry signal generated by an INC signal is inhibited during the succeeding digit cycle by the control gate 278 (since an INC logic 1 signal cannot be generated during a $\overline{CT}$ logic 1 signal).

An A register BCD input is adapted to be selectively written into an A register decade during the write phase ($\bar{\phi}$) of the corresponding digit cycle by an A register write signal established by an A register write control logic circit 290. Similarly, a B register BCD input is adapted to be selectively written into a B register decade during the write phase $\bar{\phi}$ of the corresponding digit cycle by a B register write signal established by a B register write control logic circuit 300. A C register BCD input is adapted to be selectively written into a C register decade during the write phase $\bar{\phi}$ of the corresponding digit cycle by a C register write signal established by a C register write control logic circuit 310. Finally, a D register write signal is adapted to be selectively applied to the D register by a D register write control logic circuit 320. Of course, as the write address circuit 136 provides for addressing the decades and digits during $\bar{\phi}$, data written into each of the registers A, B, C and D is entered during the write phase $\bar{\phi}$ and after the corresponding decade or digit has been read and the read data is stored in the corresponding latch 142.

Upon reference to the write control circuits 290, 300, 310 and 320, it can be seen that a write signal is applied to the A register (a) when the A register mode switch 156 is closed (to generate a SET A signal) and by an INC signal to increment a selected A register digit with an external push button; (b) when the latch selector switch 158 is closed (to generate an LS signal) and by $\overline{R2}$ while the C2 register is being reset (and to therefore transfer the amount stored in the C2 register (via a C register output selector logic circuit 295) to the A2 register as the C2 register is being reset); and (c) by the combination of a BCD Set logic 1 signal (provided automatically when not inhibited by an ES entry select signal or by the combination of LS and S2 signals), a PWR power on signal and an $\overline{RS}$ signal (and therefore during the alternate A register cycles), upon which occurrence the externally generated BCD digit inputs I0-I3 are applied to the corresponding A register decades for automatically updating or refreshing the A register decades. The B register write control circuit 300 is similarly designed (a) for automatically entering the externally generated BCD digit inputs I0-I3 for updating or refreshing the B register decades during the B register cycle RS, and (b) for incrementing the B register decades via the arithmetic unit 270 when the B register mode switch 157 is closed and by an INC signal generated by an external push button.

The C register write select circuit 310 is operated to apply a write signal to the C register by $\widehat{CT}$ (to index or step the corresponding C1 and C2 registers) and by $\widehat{R1}$ and $\widehat{R2}$ for respectively resetting the C1 and C2 registers. A write signal is applied to the D register by the combination of ES (i.e., during register digits programmed externally for push button entry), a PWR power on signal and RS (i.e., only during the B register cycle). RS is employed as a control so that any D register input entered into a digit of the D register during the B register cycle is not altered during succeeding A register cycles and can be read during succeeding B register cycles until erased.

An increment control logic circuit 330 is provided for generating the increment signal INC for selectively incrementing the A and B register decade counts with the external push buttons as previously described. The increment control circuit 330 is connected to be inhibited via the OR gate 312 of the C register write control circuit 310 by $\widehat{CT}$, $\widehat{R1}$ and $\widehat{R2}$ and so that the C1 and C2 register counting and resetting functions have priority over the push button entry of data into the A and B registers. When not inhibited by the C register write control circuit 310, when an external push button is depressed, an I1 signal is transmitted via an AND gate 332 and OR gate 334 as an input to the corresponding digit of the D register, and if the D register digit during the immediately preceding digit read phase of the B register cycle held a logic 0, an INC signal is generated during the read digit phase and a logic 1 is written into the D register digit during the immediately succeeding write phase of the digit cycle. After a logic 1 is written into the D register digit, the AND control gate 336 is made non-conductive to avoid generating repetitive INC logic 1 signals when the digit is read again during succeeding B register cycles. Also, $\overline{I0}$ in combination with the D register digit output stored in the respective latch 142 cooperate to retain the logic 1 in the D register digit until the push button is released and $\overline{I0}$ returns to logic 0. Accordingly, if switch bounce occurs when the push button is depressed and repetitive I1 logic 1 signals are generated ($\overline{I0}$ remaining at logic 1), the corresponding D register digit will be incremented or indexed only once. Similarly, if a $\widehat{CT}$, $\widehat{R1}$ or $\widehat{R2}$ logic 1 signal is applied to the OR gate 312 while the AND gate 332 is conductive, the AND gate 339 will be made conductive to retain the logic 1 in the D register digit. The foregoing operation of generating an INC logic 1 signal and incrementing the D register is controlled by the entry select signal ES through the D register write control circuit 320. The entry signal ES provides as described for selecting the digits which are activated for push button entry.

Thus, each A register decade can be incremented via an external push button circuit (depending upon the external circuitry employed) by closing the A register mode selector switch 156 (to transmit the A register output to the arithmetic unit 270) and by depressing the appropriate push button to generate an INC logic 1 signal during the selected digit cycle. Likewise, each decade of the B register section is adapted to be incremented via an external push button circuit (depending upon the external circuit provided) by closing the B register mode selector switch 157 and depressing the appropriate push button. In both cases, the count of the selected register would be simultaneously displayed by the external display register 150 to facilitate incrementing the selected register to the desired count.

Referring to FIG. 4, the LSI chip 100 incorporates a comparison circuit 350 adapted for generating A1P, and B1P predetermining signals when the count stored in the C1 register equals the count stored in the A1 and B1 registers respectively. Similarly, the comparison circuit 350 is adapted for generating A2P and B2P predetermining signals when the count stored in the C2 register equals the count stored in the A2 and B2 registers respectively. Alternatively, as previously described, the B1P and B2P predetermining signals are generated when the respective C1, C2 registers are indexed to zero (in either the adding or subtracting direction) and the respective preset control switches 250, 251 are closed.

A predetermining signal is generated during the write phase $\bar{\phi}$ of the last digit cycle of the applicable C1, C2 register during which the $\widehat{CT}$ count signal is applied to index the applicable C1, C2 register to the count stored in the corresponding A and B registers respectively. Thus, the B1 and B2 registers can be preset for generating predetermining signals B1P and B2P for de-energizing or deactivating the respective devices 173, 174 after a predetermined operation thereof determined by the rate of pulse generation by the respective pulse generators 175 and the counts stored in the B1 and B2 registers. Similarly, the A1P and A2P predetermining signals can be employed for slowing the respective devices 173, 174 at a predetermined point before the devices are de-energized as determined by the counts stored in the A1 and A2 registers. It can be seen that the A register and B register predetermining signals can be used in the reverse manner depending on the counts stored in the A1, B1 and A2, B2 registers, and the predetermining signals can be used in many different ways for performing, controlling, predetermining and calculating functions. Also, the primary power signal PWR is shown employed to control the A2P and B2P predetermining signals to save power when the primary power supply 102 fails.

The A1P, A2P, B1P and B2P LSI chip outputs can also be used as inputs to the LSI chip for controlling the logic functions of the chip. For example, the C1 register predetermining outputs A1P, B1P can be selectively used as C1 or C2 register reset inputs to the reset circuit 180 for resetting the C1 and C2 registers respectively. Likewise, the C2 register predetermining outputs A2P, B2P can be selectively used as C1 or C2 register reset inputs to the reset circuit for resetting the C1 and C2 registers respectively. As previously described, the predetermining logic 1 signals are generated during the last digit cycle of the respective C1, C2 register cycle at which the register is indexed to the preset count. Therefore, the reset circuit 180 is suitably designed for temporarily storing any such C1 and C2 register input reset pulses for generating corresponding R1 and R2 logic 1 reset signals during the immediately succeeding C1 and C2 register cycles respectively.

When the multiply selector switch 178 is closed to provide for accumulating a count in the C2 register equal to the product of the number of CT1 input pulses and a number stored in the A1 register (or alternatively, in the B1 register), the A1P predetermining output (or alternatively, the B1P predetermining output where the B1 register is employed for storing the predetermined amount) is connected directly to the C1 register reset input to automatically timely reset the C1 register and discontinue stepping the C2 register at the 10 kHz RAM cycle frequency as previously described. Also, it can be seen that as the C1 and C2 registers are reset via the arithmetic unit and by applying a BCD 0000 input to the arithmetic unit summation circuit 272, the CT1 and CT2 input pulses are effective to step the C1 and C2 registers during the same RAM cycle during which the registers are reset. Thus, the C1, C2 register resetting cycles will not momentarily slow down the counting speed of the LSI chip or result in inadvertently dropping CT1 or CT2 input pulses.

The latch select switch 158 can be used, for example, to compute and display a tachometer or other rate output (e.g. number of units per second, minute or other time interval or number of units of one input relative to a fixed number of units of another input such as the number of inches of yarn used in a predetermined number of operating cycles of a knitting machine). Where a rate output based on a time interval is to be provided, a predetermined time interval input pulse such as a second pulse (i.e. one pulse per second) is supplied as the CT1 input for accumulation in the C1 register. A second input pulse for which the rate computation is desired is supplied as the CT2 input to be accumulated in the C2 register. The base time interval (e.g. 60 seconds) is preset in the A1 register (or B1 register as desired) and such that an A1P logic 1 predetermining signal (or B1P predetermining signal as appropriate) is generated at the end of the base time interval. The A1P output (or B1P output as appropriate) is connected to the C1 and C2 register reset contacts for resetting both the C1 and C2 registers to zero at the end of the predetermined interval for initiating a succeeding rate computation. While the C2 register is reset (with the latch selector switch 158 closed), the accumulated count in the C2 register is transferred to the A2 register for storing and displaying the computed rate. Also, the display selector 146 is automatically operated (with the A and B register select switches 156, 157 closed to select the C register) to display the C1 register output and the A2 register output and thus to respectively display the time interval in process and the prior rate computation stored in the A2 register. Thus, rate computations are being continuously successively made and each computed rate is written into the A2 register at the end of the computation cycle for storing and displaying the rate, whereby, external adjustment of the rate is facilitated. Also, it can be seen that any automatic loading of the A2 register digits with any corresponding BCD inputs I0-I3 is inhibited by the combination of LS and S2 to free the A2 register for receiving and storing the rate computation as described.

As can be seen, the LSI chip core counting circuit 100 can therefore be used in a variety of applications and for a variety of purposes. The LSI chip core counting circuit can be used for predetermining and controlling functions and for product and rate or other division computation and for displaying the desired date with an external display. Of course, the external circuitry employed with the LSI chip core counting circuit will depend upon the application and where flexibility is not needed, the switch controlled inputs for mode selection, preset selection, count direction selection, partition selection and reset selection can be left open or hard wired, closed or connected to the predetermining output contacts as desired to eliminate unnecessary switches.

As will be apparent to persons skilled in the art, various modifications, adaptations and variations of the foregoing specific disclosure can be made without departing from the teachings of the present invention.

I claim:

1. An electrical core counting circuit comprising count storage means having a plurality of multiple decade BCD storage registers collectively providing a plurality of BCD decade sets, each comprising a plurality of corresponding BCD storage decades of the plurality of BCD storage registers respectively, core circuit input connector means for transmitting input signals to the core circuit; and input signal operated control circuit means connected to the input connector means and selectively operable by partitioning input signals applied to the input connector means for selectively operationally dividing the count storage means into a plurality of operationally separate sections thereof, each comprising a selected number of BCD decade sets of ascending order of significance forming BCD storage register sections of the plurality of BCD storage registers respectively each with BCD decades of ascending order of significance; the input signal operated control circuit means being selectively operable by count entry input signals applied to the input connector means for selectively entering a count into each BCD storage register section of a first of said storage registers, and being selectively operable by a plurality of count input trains, of count input signals applied to the input connector means, for the plurality of sections respectively of the count storage means for accumulating separate counts in the register sections respectively of a second of said storage registers by stepping the accumulated count of each second storage register section with each respective count input signal, the input signal operated control circuit means comprising comparator circuit means operable in accordance with the partitioning input signals applied to the input connector means for generating a predetermining signal when the accumulated count in each second storage register section equals the count entered into the respective first storage register section.

2. An electrical core counting circuit according to claim 1 wherein the input signal operated control circuit means is selectively operable by a plurality of reset input signals, applied to the input connector means, for the plurality of second register sections respectively for selectively resetting the respective second storage register sections to zero.

3. An electrical core counting circuit according to claim 1 wherein the input signal operated control circuit means is selectively operable by a plurality of count direction input signals, applied to the input connector means, for the plurality of second register sections respectively for selectively establishing the direction the accumulated count in each respective second storage register section is stepped with the respective count input signal.

4. An electrical core counting circuit according to claim 1 wherein the input signal operated control circuit means comprises sequencing means providing decade sequencing signals for simultaneously activating the corresponding BCD storage decades of each BCD decade set and activating the BCD decade sets of each section of the count storage means in an ascending order sequence, and core circuit output connector means connected to the sequencing means for supplying the decade sequencing signals externally of the electrical core counting circuit, the input signal operated control circuit means being selectively operable by count entry input signals applied to the input connector means and timed with the decade sequencing signals for selectively and separately entering a count into each BCD decade of said first storage register.

5. An electrical core counting circuit according to claim 1 wherein the input signal operated control circuit means is selectively operable by the partitioning input signals applied to the input connector means for selectively providing a single operational BCD storage unit composed of all of said plurality of BCD decade sets and dividing the count storage means into two of said operationally separate sections thereof.

6. An electrical core counting circuit according to claim 1 wherein the count storage means comprises a plurality of said BCD storage registers collectively providing a plurality of $n$ said BCD decode sets, and wherein the input signal operated control circuit means is selectively operable by the partitioning input signals applied to the input connector means for selectively operationally dividing the count storage means into two said operationally separate sections with a first of said separate sections having a selected number $a$ of said BCD decade sets where $a$ is any number between 1 and $n-1$ and with a second of said separate sections having a remaining number $b$ of said BCD decade sets equal to $n-a$.

7. An electrical core counting circuit according to claim 1 wherein the input signal operated control circuit means comprises an arithmetic unit having a BCD input and a BCD output and selectively alternatively operable to provide a BCD output count equal to the BCD input count and to an incremented count thereof and hold any resulting carry for a succeeding incremented count operation of the arithmetic unit, and wherein the input signal operated control circuit means is operable by each count input signal, applied to the input connector means, of each count input train for stepping the accumulated count in the respective second storage register section by successive operations of the arithmetic unit for the BCD decades of ascending order respectively thereof, and entering an incremented output count from the arithmetic unit into the lowest order BCD decase of the second storage register section of the prior count therein and entering an incremented output count from the arithmetic unit in any higher order BCD decade of the prior count thereof where a carry results from the arithmetic unit operation for the adjacent lower order BCD decade.

8. An electrical core counting circuit according to claim 7 wherein the input signal operated control circuit means is selectively operable by count entry input signals applied to the input connector means for selectively entering a count into each BCD storage decade of said first storage register by selectively operating the arithmetic unit to enter into the BCD decade an incremented count output of the arithmetic unit of the prior count of the BCD decade.

9. An electrical core counting circuit according to claim 1 wherein the comparator circuit means is alternatively operable for generating a predetermining signal when the accumulated count in each second storage register section equals zero and the count entered into the corresponding first storage register section, wherein the input signal operated control circuit means is selectively alternatively operable by reset input signals and preset control input signals, applied to the input connector means, for each second register section for selectively alternatively resetting each second storage register section to zero and to the count entered into the respective first storage register section and operate the comparator circuit means in conjunction therewith to generate a predetermining signal when the count in the respective second register section equals the count entered into the corresponding first storage register section and zero respectively.

10. An electrical core counting circuit according to claim 1 wherein the count storage means comprises at least three of said multiple decade BCD storage registers, wherein the input signal operated control circuit means is selectively operable by the count entry input signals applied to the input connector means for selectively entering a count into each first storage register section and into each storage register section of a third storage register, and wherein the comparator circuit means is operable for generating a predetermining signal when the accumulated count of each second storage register section equals each count entered into the corresponding first and third storage register sections.

11. An electrical core counting circuit according to claim 1 wherein the input signal operated control circuit means comprises decade sequencing means for activating the corresponding BCD storage decades of each BCD decade set together and activating the BCD decade sets of each section of the count storage means in an ascending order sequence, wherein the count storage means comprises, for each of said BCD storage registers, a BCD input for writing a BCD count into the active BCD decade of the storage register and a BCD output for reading the BCD count of the active BCD decade of the storage register, and wherein the input signal operated control circuit means comprises write control means for each BCD storage register selectively operable for writing the respective BCD input count into the active BCD decade of the storage register, an arithmetic unit having a BCD input and a BCD output and selectively alternatively operable to provide a BCD output count equal to the BCD input count and to an incremented count thereof and hold any resultant carry for a succeeding incremented count operation of the arithemetic unit, and BCD decade selector means selectively operable for operatively connecting the arithmetic unit and second storage register and operating the second register write control means for selectively incrementing the BCD count of each BCD decade of the second storage register, the input signal operated control circuit means being operable by each count input signals, applied to the input connector means, of each count input train for selectively operating the decade selector means in synchronism with the decade sequencing means to increment the count of the lowest order BCD decade of the respective second register section and increment any higher order decade of the respective second register section where a carry results from the operation of the arithmetic unit for the adjacent lower order decade.

12. An electrical core counting circuit according to claim 11 wherein the decade selector means is selectively operable for operatively connecting the arithmetic unit and first storage register and operate the first storage register write control means for selectively incrementing the BCD count of each BCD decade of the first storage register, and is selectively operable by the count entry input signals applied to the input connector means, in synchronism with the decade sequencing means, for selectively incrementing the count of each BCD decade of the first BCD storage register.

13. An electrical core counting circuit according to claim 12 wherein the count storage means comprises at least three of said multiple decade BCD storage registers, wherein the decade selector means is selectively operable for operatively connecting the arithmetic unit and a third storage register and operate the third storage register write control means for selectively incrementing the BCD count of each BCD decade of the third storage register, and is selectively operable by the count entry input signals applied to the input connector means, in synchronism with the decade sequencing means, for incrementing the count of each BCD decade of the third BCD storage register.

14. An electrical core counting circuit according to claim 13 wherein the count entry input signals comprise register select input signals applied to the input connector means for selectively operating the decade selector means for selectively operatively connecting said first and third storage registers to the arithmetic unit for incrementing the BCD decade counts of the selected BCD storage register.

15. An electrical core counting circuit according to claim 14 further comprising readout connector means and readout selector means for selectively connecting the BCD outputs of the plurality of BCD storage registers to the readout connector means for selectively reading the count stored in each storage register, the readout selector means being operable by the register select input signals applied to the input connector means for reading the BCD storage register operatively connected to the arithmetic unit.

16. An electrical core counting circuit according to claim 1 wherein the input signal operated control circuit means comprises means providing high frequency clocking signals and counting control circuit means adapted to be selectively cycled for selectively stepping the accumulated count of each second register section with the clocking signals; the input signal operated control circuit means being selectively operable by each count input signal of each count input train for cycling the counting control circuit means through a count cycle for stepping the accumulated count of the respective second storage register section.

17. An electrical core counting circuit according to claim 16 wherein the counting control circuit means is adapted to be selectively conditioned by multiply input signals applied to the input connector means to e repetitively cycled by the clocking signals for each count input signal, applied to the input connector means of one count input train, for repetitively stepping the accumulated counts of the respective second storage register section and an additional second storage register section with the clocking signals, and wherein the input signal operated control circuit means is selectively operable by reset input signals applied to the input connector means, for selectively terminating said repetitive stepping of the accumulated counts of the second storage register sections with the clocking signals and resetting said respective storage register section.

18. An electrical core counting circuit according to claim 1 wherein the input signal operated control circuit means comprises sequencing means for activating the corresponding BCD storage decades of each BCD decade set together and activating the BCD decade sets of each section of the count storage means in an ascending order sequence, wherein each multiple decade BCD storage register has a BCD input for entering a BCD count into the active BCD decade of the storage register and a BCD output for reading the BCD count of the active BCD decade of the storage register, and wherein the input signal operated control circuit means comprises write control means for each BCD storage register selectively operable for writing the respective BCD input into the acctive BCD decade of the storage register, an arithmetic unit having a BCD input and a BCD output and selectively alternatively operable to alternatively provide a BCD output count equal to the BCD input count and an incremented count thereof and hold any resulting carry for a succeeding incremented count operation of the arithmetic unit, and arithmetic unit selector means for selectively operatively connecting the arithmetic unit to each of the plurality of BCD storage registers for selectively incrementing the BCD decade counts thereof, the input signal operated control circuit means being operable by each count input signal of each count input train for selectively operating the arithmetic unit and arithmetic unit selector means in synchronism with the sequencing means to index the accumulated count of the respective second storage register section, and being selectively operable by the count entry input signals applied to the input connector means for selectively operating the arithmetic unit and arithmetic unit selector means in synchronism with the sequencing means to selectively increment the accumulated count of each BCD decade of the first storage register.

19. An electrical core counting circuit according to claim 18 wherein the arithmetic unit selector means is selectively operable to connect the BCD input of the arithmetic unit to BCD zero, and wherein the input signal operated control circuit means is selectively operable by a plurality of reset input signals, applied to the input connector means, for the plurality of second storage register sections respectively, for selectively operating, in synchronism with the sequencing means, the arithmetic unit selector means to connect the BCD input of the arithmetic unit to BCD zero and the arithmetic unit to selectively reset the respective second storage register section to zero.

20. An electrical core counting circuit according to claim 18 wherein the input signal operated control circuit means is selectively operable by reset signals applied to the input connector means for selectively operating, in synchronism with the sequencing means, the arithmetic unit selector means, arithmetic unit and second register write control means for selectively transferring the count from at least one of the first register sections via the arithmetic unit to the corresponding second register section.

21. An electrical core counting circuit according to claim 18 wherein the input signal operated control circuit means comprises register selector means for selectively connecting the second register output to the first register input and is selectively operable by latch select and reset signals applied to the inner connector means for selectively operating, in synchronism with the sequencing means, the register selector means and first register write control means for transferring the accumulated count from at least one second register section to the corresponding first register section and simultaneously reset the second register section to zero.

22. An electrical counting circuit comprising a bank of a plurality of multiple decade BCD storage registers collectively providing a plurality of BCD decade sets, each comprising a BCD storage decade of each of the plurality of BCD storage registers, sequencing means for activating the BCD storage decades of each BCD decade set together and activating the BCD decade sets in a predetermined sequence, each multiple decade BCD storage register having a BCD input for entering a BCD count into the active BCD decade of the storage register and a BCD output for reading the BCD count of the active BCD decade, input connector means for transmitting input signals to the electrical counting circuit, and input signal operated control circuit means connected to the input connector means comprising write control means for each BCD storage register selectively operable for writing the respective BCD input into the active BCD decade of the storage register, an arithmetic unit having a BCD input and a BCD output and selectively operable to provide an incremented BCD output count of the BCD input count thereof and hold any resultant carry for a succeeding incremented count operation of the arithmetic unit, and arithmetic unit selector means for selectively operatively connecting the arithmetic unit to each storage register for selectively incrementing the count of each BCD decade thereof, the input signal operated control circuit means being operable by a count input train of count input signals applied to the input connector means to operate the arithmetic unit and arithmetic unit selector means in synchronism with the sequencing means to increment the count of a first storage register with each count input signal means, and being selectively operable by BCD entry signals applied to the input connector means to selectively enter a BCD count into each BCD decade of a second of said BCD storage registers and being selectively operable by increment entry signals applied to the input connector means to operate the arithmetic unit and arithmetic unit selector means is synchronism with the sequencing means to selectively increment the BCD count of each BCD decade of said second storage register.

23. An electrical counting circuit according to claim 22 further comprising BCD entry means connected to the sequencing means for operation in synchronism therewith and operable for applying to the input connector means a BCD entry signal for at least one BCD decade of the second storage register in synchronism with the activation thereof for operating the input signal operated control circuit means for entering a BCD count into the BCD decade, and increment entry means connected to the sequencing means for operation in synchronism therewith and selectively operable for generating an incrementing signal for at least one BCD decade of the second storage register in synchronism with the activation thereof for operating the input signal operated control circuit means to increment the BCD decade through incremented count operation of the arithmetic unit.

24. An electrical counting circuit according to claim 23 wherein the BCD entry means and increment entry means are operable to provide dual entry into at least one BCD decade of said second BCD storage register to provide a dual entry decade, and further comprising switch entry selector means for selectively connecting the BCD entry means and increment entry means for operating the input signal operated control circuit means for selective entry into each said dual entry decade during activation thereof.

25. An electrical counting circuit according to claim 24 wherein the BCD entry means and increment entry means are operable to provide dual entry into each of the BCD decades of the second storage register.

26. An electrical counting circuit comprising an integrated solid state circuit portion with at least one multiple decade BCD storage register with a plurality of BCD storage decades for storing BCD counts therein, decade operating means for sequentially activating the BCD storage decades of each BCD storage register and read the BCD count of and write a BCD count into the active BCD storage decade, an arithmetic unit selectively operable with the decade operating means to increment the BCD count of the active BCD storage decade of each BCD storage register and hold any resulting carry for incrementing the BCD count of the succeeding active decade of the storage register, entry connector means, and decade selector means connected to the entry connector means and selectively operable by entry input signals applied to the entry connector means for selectively operating the arithmetic unit with the decade operating means to increment the count of selected BCD decades of each storage register; and an entry circuit portion connected to the entry connector means of the solid state circuit portion for applying entry input signals thereto, the entry circuit portion comprising BCD count entry means operable for applying to the entry connector means, a BCD count entry signal for at least one of the BCD decades in synchronism with the activation thereof for operating the decade operating means for writing the BCD count of the BCD count entry signal into the BCD decade, and increment entry means operable for applying to the entry connector means an increment signal for at least one of the BCD decades in synchronism with the activation thereof for operating the decade selector means with the arithmetic unit for incrementing the BCD count of the BCD decade.

27. An electrical counting circuit according to claim 26 wherein the entry circuit portion comprises entry select means for applying to the entry connector means individual decade increment select signals for operating the decade operating means for individually selecting each BCD decade of said storage register for incrementation of the count thereof with the corresponding increment signal.

28. An electrical counting circuit according to claim 27 wherein the integrated solid state circuit portion comprises a plurality of said multiple decade BCD storage registers, wherein the entry select means comprises storage register select means for applying to the entry connector means register select signals for individually selecting the BCD storage registers for incrementation of the BCD decade counts thereof with the increment signals; and wherein the integrated solid state circuit portion comprises readout connector means and readout selector means operable by the register select signals applied to the input connector means for selectively connecting the plurality of storage registers respectively to the readout connector means for selectively reading the storage registers; and further comprising a register readout circuit portion connected to the readout connector means of the integrated circuit portion for providing a readout of the selected storage register.

29. An electrical core counting circuit comprising an integrated circuit portion with a plurality of BCD storage registers, each having a plurality of BCD storage words for storing a plurality of BCD counts therein, sequencing means for activating the storage words of each BCD storage register in a predetermined sequence, write means selectively operable for writing a BCD count into the active storage word of each storage register, entry connector means, and input signal operated control means selectively operable by entry signals applied to the entry connector means for selectively operating the write means for writing a BCD count established by the entry signals into each BCD storage register word; and an entry circuit portion connected to the entry connector means of the solid state circuit portion for supplying entry signals thereto, the entry circuit portion comprising BCD switch means operable for generating BCD count entry signals for at least one word of each storage register, and entry select means selectively operable for generating storage register word select signals for individually selecting the words of each storage register for entry of a BCD count therein with the corresponding BCD count entry signals; the input signal operated control means of the integrated circuit portion being operable by the word select signals and the BCD count entry signals to operate the write means for writing the BCD count entry signals into the respective storage register decade.

30. An integrated solid state core counting circuit comprising count storage means with at least one multiple decade BCD storage register having a plurality of BCD storage decades, core circuit input connector means for transmitting input signals to the core circuit; and input signal operated control circuit means connected to the input connector means and selectively operable by partitioning input signals applied to the input connector means for selectively operationally dividing the count storage means into a plurality of operationally separate sections thereof, having respective sections of each BCD storage register with selected numbers of BCD storage decades established by the partitioning signals, the input signal operated control circuit means being selectively operable by a plurality of count input trains of count signals, applied to the input connector means, for the plurality of separate sections of the count storage means respectively for accumulating separate counts in the respective storage register sections of said one BCD storage register by stepping the accumulated count of section of said one BCD storage register with each respective count signal.

31. An integrated solid state core counting circuit comprising count storage means with a plurality of multiple decade BCD storage registers collectively providing a plurality of BCD decade sets composed of corresponding BCD decades of the plurality of BCD storage registers respectively, core circuit input connector means for transmitting input signals to the core circuit; and input signal operated control circuit means connected to the input connector means and selectively operable by partitioning input signals applied to the input connector means for selectively operationally dividing the count storage means into two operationally separate sections thereof, each comprising a BCD storage register section of each of the plurality of BCD storage registers and a selective number of BCD decade sets; the input signal operated control circuit means being selectively operable by count entry signals applied to the input connector means for selectively entering a count in each storage register section of a first of said BCD storage registers, and being selectively operable by two separate count input trains of count input signals, applied to the input connector means, for the two separate sections respectively of a second of said storage registers for accumulating separate counts in the respective second storage register sections by stepping the accumulated count of each second storage register section with each respective count input signal, the input signal operated control circuit means being selectively operable by latch select and reset input signals applied to the input connector means for selectively resetting one of said two second storage register sections and simultaneously transfer the count of said one second storage register section to the corresponding first storage register section.

32. An integrated solid state core counting circuit comprising count storage means with a plurality of multiple decade BCD storage registers providing a plurality of BCD decade sets of corresponding BCD storage decades of the BCD storage registers respectively, core circuit input connector means for transmitting input signals to the core circuit; and input signal operated control circuit means connected to the input connector means and selectively operable by partitioning input signals applied to the input connector means for selectively operationally dividing the count storage means into at least two operationally separate sections thereoff, each comprising sections of said plurality of registers respectively, with selective numbers of BCD decade sets respectively, and input signal operated control circuit means being adapted to be selectively alternatively set by multiply/non-multiply select control signals applied to the input connector means to multiplication and non-multiplication modes of operation, the input signal operated control circuit means in its non-multiplication mode being selectively operable by entry input signals applied to the input connector means for selectively entering a count into each storage register section of a first of said storage registers, and being selectively operable by a plurality of external count input trains of relatively low frequency count signals, applied to the input connector means, for the plurality of sections respectively of a second storage register for accumulating separate counts in the respective second storage register sections by indexing the accumulated count of each second storage register section with each respective count signal, the input signal operated control circuit means in its multiplication mode being operable for a multiplication indexing operation of first and second sections of said second storage register together at a relatively high rate upon the occurrence of each count signal of the count input train for the first section of said second storage register, the input signal operated control circuit means comprising comparator circuit means operable for generating predetermining signals when the accumulated count in the first section of the second storage register equals the count entered into the corresponding first storage register section, the input signal operated control circuit means being operable in its multiplication mode by the predetermining signals for terminating the multiplication indexing operation and resetting the first section of the second storage register to zero.

33. An electrical counting circuit comprising an integrated solid state core circuit having count storage means with at least one multiple decade BCD storage register, core circuit input connector means for transmitting input signals to the core circuit, and input signal operated control circuit means connected to the input connector means and selectively operable by partitioning input signals applied to the input connector means for selectively operationally dividing the count storage means into a plurality of operationally separate sections thereof, each having a BCD storage register section of each storage register of the count storage means, the input signal operated control circuit means being selectively operable by a plurality of count input trains of count signals, applied to the input connector means, for the plurality of BCD storage register sections respectively of said one BCD storage register for accumulating separate counts in the storage register sections of said one BCD storage register by stepping the accumulated count of each storage register section thereof with each respective count signal.

34. An electrical counting circuit according to claim 33 wherein the input signal operated control circuit means comprises decade sequencing means for repetitively activating the BCD storage decades of each BCD storage register of the count storage means in a predetermined sequence for accumulating counts in the storage register sections of said one BCD storage register in a corresponding sequence, and partitioning select circuit means connected to the input connector means and selectively operable by the partitioning input signals applied to the input connector means for establishing the BCD decade sequence of each register section of said one BCD storage register and thereby set the number of BCD decades in each register section.

35. An electrical core counting circuit comprising count storage means having a plurality of multiple decade BCD storage registers collectively providing a plurality of BCD decade sets, each comprising a plurality of corresponding BCD storage decades of the plurality of BCD storage registers respectively, core circuit input connector means for transmitting input signals to the core circuit; and input signal operated control circuit means connected to the input connector means and selectively operable by entry input signals applied to the input connector means for selectively entering a count into a first of said storage registers, and being selectively operable by a count input train of count input signals applied to the input connector means, for accumulating a count in a second of said storage registers by stepping the accumulated count of the second storage register with each count signal, the input signal operated control circuit means comprising comparator circuit means operable to generate a predetermining signal when the second storage register equals the count entered into the first storage register, the input signal operated control circuit means comprising decade sequencing means for activating the corresponding BCD storage decades of each BCD decade set together and activating the BCD decade sets in an ascending order sequence, the count storage means comprising, for each of said BCD storage registers, a BCD input for writing a BCD count into the active BCD decade of the storage register and a BCD output for reading the BCD count of the active BCD decade of the storage register, and the input signal operated control circuit means comprising write control means for each said BCD storage register selectively operable for writing the respective BCD input count into the active BCD decade of the storage register, an arithmetic unit having a BCD input and a BCD output and selectively alternatively operable to provide a BCD output count equal to the BCD input count and to an incremented count thereof and hold any resultant carry for a succeeding increment count operation of the arithmetic unit, and arithmetic unit selector means for selectively operatively connecting the arithmetic unit to the second storage register for incrementing the BCD count of each BCD decade thereof, the input signal operated control circuit means being operable by each count input signal, applied to the input connector means, for stepping the accumulated count of the second storage register by operating the arithmetic unit, arithmetic unit selector means and second register write control means in synchronism with the decade sequencing means to increment the count of the lowest order BCD decade of the second storage register and increment any high order decade of the second register where a carry results from an increment operation of the arithmetic unit for the adjacent lower order decade.

36. An electrical core counting circuit according to claim 35 wherein the comparator circuit means is alternatively operable for generating a predetermining signal when the accumulated count in the second register equals zero and the count entered into the first storage register, wherein the input signal operated control circuit means is selectively operable by reset input signals and preset control input signals, applied to the input connector means, for selectively alternatively resetting the second storage register to zero and presetting the second storage register to the count entered into the first storage register and operate the comparator circuit means in conjunction therewith to generate a predetermining signal when the count in the second register equals the count entered into the first storage register and zero respectively.

* * * * *

UNITED STATES PATENT OFFICE
CERTIFICATE OF CORRECTION

Patent No. 3,946,219                     Dated March 23, 1976

Inventor(s) RICHARD K. LUCAS

It is certified that error appears in the above-identified patent and that said Letters Patent are hereby corrected as shown below:

Column 2, line 57, delete "powder" and insert --power--.
Column 2, line 48, delete "23" and insert --Twenty-three--.
Column 3, line 18, after "cycle", delete "to" second occurrence and insert --of--.
Column 3, line 46, delete "cycle" and insert --cycles--.
Column 4, line 49, delete "12" and insert --120--.
Column 7, line 59, delete "pulse" and insert --pulses--.
Column 11, line 67, delete "R1" and insert --R1--.
Column 12, lines 26 and 28, "add one" should be in quotes.
Column 12, line 32, delete "DR" and insert --DR--.
Column 13, line 3, delete "circit" and insert --circuit--.
Column 14, line 18, delete "and" and insert --and--.
Column 18, line 22, delete "decase" and insert --decade--.
Column 19, line 30, delete "signals" and insert --signal--.
Column 20, line 28, delete "e" and insert --be--.
Column 20, line 56, delete "acctive" and insert --active--.
Column 21, line 39, delete "inner" and insert --input--.
Column 22, line 18, delete "is" and insert --in--.
Column 24, line 3, after "count" insert --of the BCD count--.
Column 24, line 25, after "count of" insert --each--.
Column 25, line 5, delete "thereoff" and insert --thereof--.

Column 26, line 60, delete "high" and insert --higher--.

Signed and Sealed this

Seventeenth Day of August 1976

[SEAL]

Attest:

RUTH C. MASON
Attesting Officer

C. MARSHALL DANN
Commissioner of Patents and Trademarks